United States Patent
Lee et al.

(10) Patent No.: US 7,043,512 B2
(45) Date of Patent: May 9, 2006

(54) FILTER BANK APPROACH TO ADAPTIVE FILTERING METHOD USING INDEPENDENT COMPONENT ANALYSIS

(75) Inventors: Soo-young Lee, Daejeon (KR); Hyung-Min Park, Daejeon (KR)

(73) Assignees: Korea Advanced Institute of Science and Technology, Daejon (KR); Extell Technology Corporation, Seoul (KR)

( * ) Notice: Subject to any disclaimer, the term of this patent is extended or adjusted under 35 U.S.C. 154(b) by 643 days.

(21) Appl. No.: 10/356,193

(22) Filed: Jan. 31, 2003

(65) Prior Publication Data

US 2003/0149711 A1    Aug. 7, 2003

(30) Foreign Application Priority Data

Feb. 1, 2002    (KR)    ...................... 10-2002-0005911

(51) Int. Cl.
*G06F 17/10*    (2006.01)
(52) U.S. Cl.    ........................ 708/300; 708/313; 708/322
(58) Field of Classification Search    ......... 708/300–323
See application file for complete search history.

(56) References Cited

U.S. PATENT DOCUMENTS

| | | | | |
|---|---|---|---|---|
| 4,623,980 A | * | 11/1986 | Vary ........................... | 708/313 |
| 4,829,378 A | * | 5/1989 | LeGall .................. | 375/240.11 |
| 5,517,435 A | * | 5/1996 | Sugiyama .................. | 708/322 |
| 6,396,872 B1 | * | 5/2002 | Sugiyama .................. | 375/232 |
| 2002/0198913 A1 | * | 12/2002 | Johnson ...................... | 708/313 |
| 2003/0016772 A1 | * | 1/2003 | Ekstrand ..................... | 375/350 |

* cited by examiner

*Primary Examiner*—D. H. Malzahn
(74) *Attorney, Agent, or Firm*—Scully, Scott, Murphy & Presser, PC

(57) ABSTRACT

The present invention relates to a filter bank approach to adaptive filtering method using independent component analysis. More particularly, the invention relates to a method of improving the performance of adaptive filtering method by applying independent component analysis that is capable of reflecting the secondary or even higher order statistical characteristics to adaptive filtering algorithm using the filter bank approach.

In order to implement the conventional adaptive filter algorithm using independent component analysis to the real world problem, a large number of filter training coefficients are required and also a large amount of calculation is required when a training is undertaken. This results in a very slow learning speed and the deterioration in the quality of result signals.

The adaptive filtering method using independent component analysis according to the present invention provides a method of reducing the large amount of calculation required for filter training, improving the learning speed and the quality of result signals by utilizing a filter bank approach.

Hence, the filter bank approach to adaptive filtering method using independent component analysis according to the present invention is capable of improving the performance over the conventional adaptive filtering method using independent component analysis.

24 Claims, 3 Drawing Sheets

PRIOR ART

FILTER BANK APPROACH TO ADAPTIVE FILTERING METHOD USING INDEPENDENT COMPONENT ANALYSIS

BACKGROUND OF THE INVENTION

The present invention relates to a filter bank approach to adaptive filtering method using independent component analysis. More particularly, the invention relates to a method of improving the performance of adaptive filtering method by applying independent component analysis that is capable of reflecting the secondary or even higher order statistical characteristics to adaptive filtering algorithm using the filter bank approach.

Independent component analysis is capable of separating default signals by receiving input signals of mixed sound sources from unknown channels and restoring mutually independent sound source signals.

Let us assume that N number of probabilistically independent sound sources $s(t)=[s_1(t), s_2(t), \ldots, s_N(t)]^T$ are mixed through arbitrary channels and the sound sources are measured by N number of sensors.

In this instance, if the channels could be modelled by a simple addition of weighting factors, then the measured signals $x(t)=[x_1(t), x_2(t), \ldots, x_N(t)]^T$ by the sensors could be represented as follows.

$$x(t) = A \cdot s(t) \quad \text{[Mathematical Equation 1]}$$

where, A is an unknown invertible matrix which is known as mixed matrix.

Hence, the problem here is to obtain a reverse matrix of the mixed matrix A in order to restore the sound source signals only using the sensor signals that can be measured.

However, from the perspective of the sound source signal separation, the process of obtaining a restored signal whose original sequence of the sound source signal is reversed or a restored signal whose magnitude differs significantly from the sound source signal, would not cause a serious problem since this process does not affect the waveform itself.

Consequently, a restored signal u(t) whose magnitude and sequence are different from the sound source signal is obtained from the following mathematical equation by deducing a separation matrix W which permits the above process.

$$u(t) = W \cdot x(t) \quad \text{[Mathematical Equation 2]}$$

In this instance, in order to deduce the separation matrix W, an assumption which makes the sound sources to be mutual independent is established. This means that a signal originating from one sound source dose not interfere with another signal which is originating from another sound source. This is a reasonable assumption to be made in the real world and this statistical independence is inclusive of all the statistical characteristics for any order.

Also, since the statistical independence is not related to magnitude and sequence, the separation matrix W in Mathematical Equation 2 can be obtained. The separation matrix could be trained by using the following training method which maximizes the statistical independence among the sound source signals.

$$\Delta W \propto [W^T]^{-1} - \varphi(u)x^T, \quad \text{[Mathematical Equation 3]}$$

$$\varphi(u_i(t)) = -\frac{\frac{\partial P(u_i(t))}{\partial u_i(t)}}{P(u_i(t))}.$$

where, $P(u_i(t))$ represents a value which approximates the probability density function of the sound source signal $u_i(t)$ which is to be deduced.

A mixed signal, which is a simple addition of weighting factors, is hard to find in the real world, instead the sensor receives a mixed signal that is a convolution type mixture between time delays due to the transmission and surrounding environment. The convolution type mixed signal could be represented as follows.

$$x_i(t) = \sum_{j=1}^{N}\sum_{k=0}^{K-1} a_{ij}(k)s_j(t-k) \quad \text{[Mathematical Equation 4]}$$

where, $x_i(t)$ represents measured signals, $s_j(t)$ represents N number of sound sources and $a_{ij}(k)$ represents mixed filter coefficients for the length K.

In order to separate the sound source signal, a feedforward filter structure in FIG. 1 or a feedback filter structure in FIG. 2 could be utilized.

In the feedforward filter structure, a restored signal $u_i(t)$ could be expressed as follows.

$$u_i(t) = \sum_{j=1}^{N}\sum_{k=0}^{K} w_{ij}(k)x_j(t-k) \quad \text{[Mathematical Equation 5]}$$

where, $w_{ij}(k)$ is filter coefficients for restoring the original sound source signal.

In this structure, the corresponding training methods for the coefficients $w_{ii}(0)$ with no time delay between input and output and the coefficients $w_{ii}(k)$, $k \neq 0$ with a time delay between the input and output could be expressed as follows.

$$\Delta W(0) \propto [W(0)^T]^{-1} - \varphi(u(t))x(t)^T, \quad \text{[Mathematical Equation 6]}$$

$$\Delta w_{ij}(k) \propto -\varphi(u_i(t))x_j(t-k),$$

$$\varphi(u_i(t)) = \frac{\frac{\partial P(u_i(t))}{\partial u_i(t)}}{P(u_i(t))}$$

where, w(0) is a matrix consisting of the coefficients with no time delay $w_{ij}(0)$ and each of u(t) and x(t) represents vectors consisted of $u_i(t)$ and $x_i(t)$ respectively.

The coefficients $w_{ij}(0)$ with no time delay control the size of data in order to maximize the amount of information which is transferred through a nonlinear function. The coefficients $w_{ij}(k)$ with a time delay remove the correlation between each of the outputs $\phi(u_i(t))$ of the nonlinear functions and input signals $x_j(t)$.

The restored signals $u_i(t)$ for the feedback filter structure could be expressed as follows.

[Mathematical Equation 7]

$$u_i(t) = \sum_{k=0}^{K} w_{ii}(k)x_i(t-k) + \sum_{j=1}^{N} \sum_{j \neq i k=1}^{K} w_{ij}(k)u_j(t-k)$$

[Mathematical Equation 7]

In this structure, there exists three different cases of filter coefficients. More specifically, they are the coefficients with no time delay between the input and output $w_{ii}(0)$, the coefficients with a time delay $w_{ii}(k)$, $k \neq 0$ and the differential feedback filter coefficients $w_{ij}(k)$, $i \neq j$. The training methods for each of the cases are as follows.

$$\Delta w_{ii}(0) \propto 1/w_{ii}(0) - \varphi(u_i(t))x_i(t),$$

$$\Delta w_{ii}(k) \propto -\varphi(u_i(t))x_i(t-k),$$

$$\Delta w_{ij}(k) \propto -\varphi(u_i(t))u_j(t-k),$$

$$\varphi(u_i(t)) = \frac{\frac{\partial P(u_i(t))}{\partial u_i(t)}}{P(u_i(t))}$$

[Mathematical Equation 8]

The coefficients $w_{ii}(0)$ control the size of data in order to maximize the amount of information which is transferred through a nonlinear function. The other coefficients $w_{ii}(k)$, $k \neq 0$ with a time delay produce output signals corresponding to whitening of each of the input signals with respect to time. The coefficients $w_{ij(k)}$, $i \neq j$ remove the correlation between each of the outputs $\phi(u_i(t))$ of the nonlinear functions and input signals $x_j(t)$.

FIG. 1 and FIG. 2 represent a feedforward and feedback filter structures in which each structure consists of two input and two output terminals, however, the total number of input and output terminals for each structure could be increased in order to construct a filter structure with an arbitrary number of input and output terminals. For the filter structure with an arbitrary number of input and output terminals, the same mathematical equations as represented in mathematical equations 4 through 8 which describe a convolution type mixed signal, restored signal and filter coefficient training method could equally be applied.

The restored sound source signal for the convolution type mixed signal and original sound source signal appears as whitened with respect to time. This whitening problem could be resolved by leaving the filter with the coefficients $w_{ii}(0)$ between the inputs and outputs with the same index and fixing the value of the coefficients $w_{ii}(k)$, $k \neq 0$ with a time delay to zero.

In case when pure noises can be observed, the independent component analysis could be utilized as an adaptive noise filter where the noise component of the mixed signal is removed.

FIG. 3 shows a diagram which illustrates the structure of a conventional adaptive noise filter.

As shown in FIG. 3, a signal source S(10) is transferred to a sensor via a channel, and a mixed signal with noise $s+n_0$ which is generated in the sensor by addition of a noise source $n_0$ (20) forms a primary input (30) for the noise filter.

A secondary sensor receives a noise $n_1$ via a channel which is different to that of the first sensor, it forms a reference input (40) with respect to the noise filter.

The noise $n_1$ is transformed into an output Z which is nearest to $n_0$ through an adaptive filter (50) and a system output $u=s+n_0-Z$ (70) of the noise filter is formed by deducting the output Z from the primary input $s+n_0$.

The purpose of the conventional adaptive noise filter is to obtain an output $u=s+n_0-Z$ which is nearest to the signal S from the perspective of least square. In order to achieve this object, the filter is adapted with the Least Mean Square algorithm (LMS) to minimize the total outputs of the noise filter. More specifically, the outputs of the adaptive noise filter act as an error signal for the duration of the adaptive process.

This coefficient training of the filter follows the LMS algorithm (Widrow-Hoff) and could be expressed as follows.

$$\Delta w(k) \propto u(t)n_1(t-k)$$

[Mathematical Equation 9]

where, $w(k)$ represents a $k^{th}$ filter coefficient and t is a sampling number.

The conventional noise filter as shown above utilizes the LMS method as the adaptive algorithm which only uses the secondary statistical characteristic between the noise component which is to be removed and noise sources.

In order to obtain a better noise filtering performance than the LMS adaptive algorithm, the independent component analysis could be utilized.

As shown in FIG. 3 which shows a conventional adaptive noise filter, when a signal which forms the primary input, a mixed signal of noise $s+n_0$, and a noise $n_1$ in the secondary sensor are being received, it could be assumed that the noise $n_1$ is independent from the signal S whereas it is related to $n_0$ in unknown ways.

This is a reasonable assumption to be made since the noise and signal do not affect their respective sound sources. Using the independent component analysis, the noise dependent components of the first input could be removed by using the second input as following.

$$\Delta w(k) \propto \varphi(u(t))n_1(t-k), \varphi(u(t)) = \frac{\frac{\partial P(u(t))}{\partial u(t)}}{P(u(t))}$$

[Mathematical Equation 10]

From the output of the adaptive noise filter which is obtained from the filter coefficient training, the required signal components which are independent from the noise components are obtained. The adaptive noise filter as in the case of default signal separation, the total number of input and output terminals for each structure could be increased in order to construct a filter structure with an arbitrary number of input and output terminals. For the filter structure with an arbitrary number of input and output terminals, the same mathematical equations as represented in mathematical equations 4 through 8, which describe the filter coefficient training method, could equally be applied.

However, in order to implement the adaptive filter algorithm using independent component analysis to the real world problem, a large number of filter training coefficients are required and also a large amount of calculation is required when a training is undertaken. This results in a very slow learning speed and the deterioration in the quality of result signals.

SUMMARY OF THE INVENTION

The object of the present invention is to provide a filter bank approach to adaptive filtering method using independent component analysis in order to improve the performance of the conventional adaptive filtering method using independent component analysis.

The adaptive filtering method using independent component analysis according to the present invention provides a method of reducing the large amount of calculation required for filter training, improving the learning speed and the quality of result signals by utilizing a filter bank approach

DESCRIPTION OF THE NUMERIC ON THE MAIN PARTS OF THE DRAWINGS

10: Signal Source
20: Noise Source
30: Primary Input
40: Reference Input
50: Adaptive Filter
60: Adder
70: System Output
$w_{11} w_{12} w_{21} w_{22}$: Adaptive Filter

DETAILED DESCRIPTION OF THE EMBODIMENTS

Hereinafter, preferred embodiments of the present invention will be described in detail with reference to the accompanying drawings.

Figure 1:
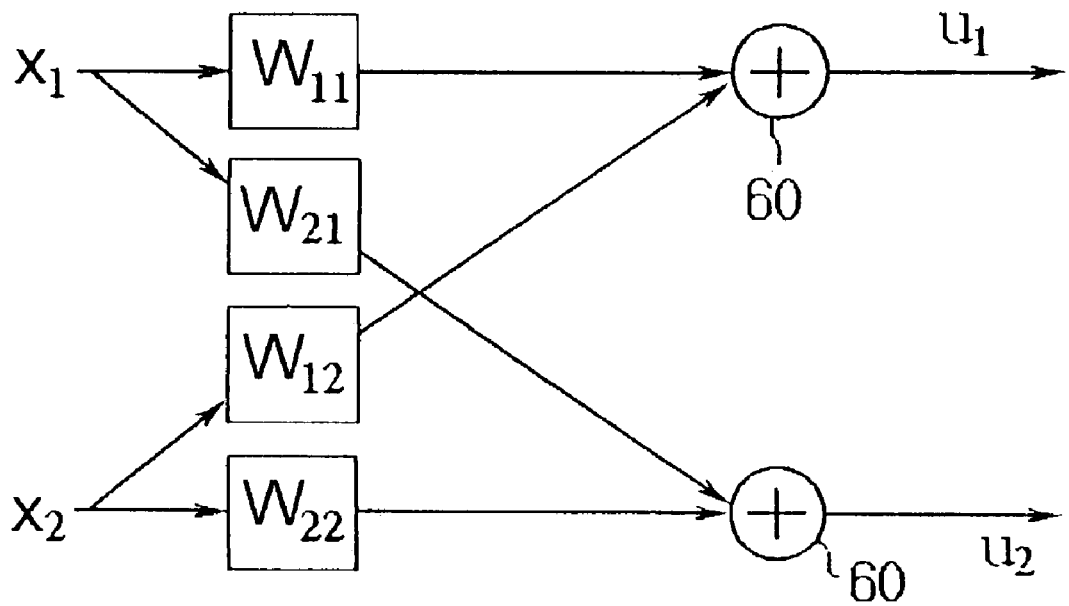
FIG. 1 shows a diagram which illustrates a conventional feedforward filter structure.
Figure 2:
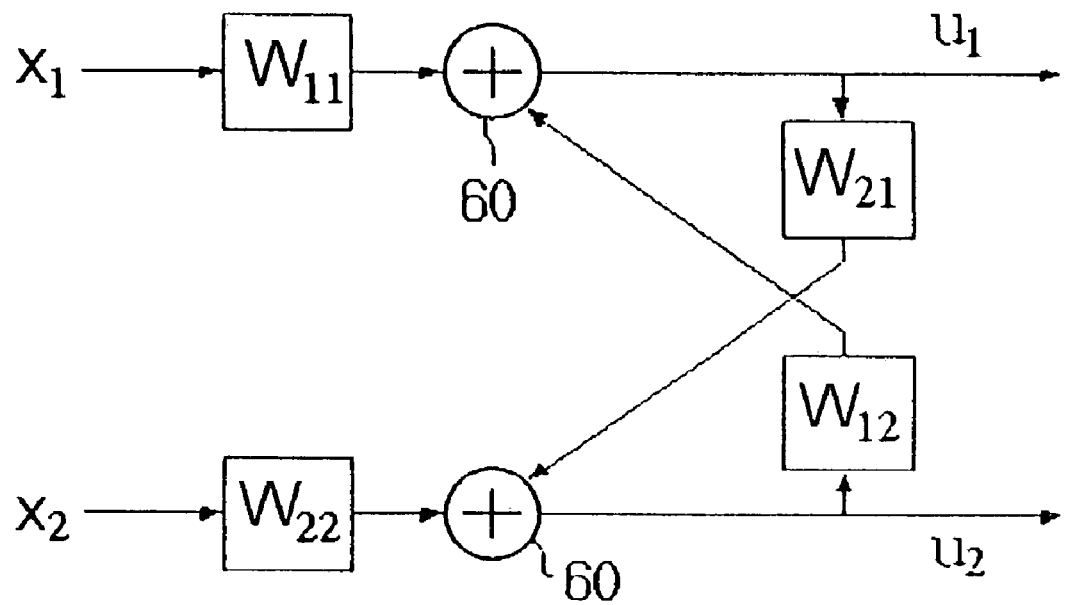
FIG. 2 shows a diagram which illustrates a conventional feedback filter structure.
Figure 3:
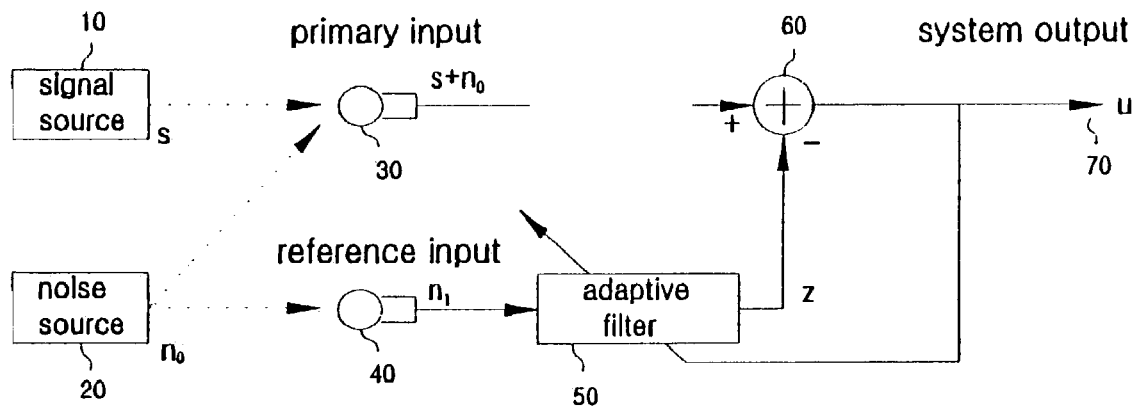
FIG. 3 shows a diagram which illustrates a conventional adaptive noise filter structure.
Figure 4:
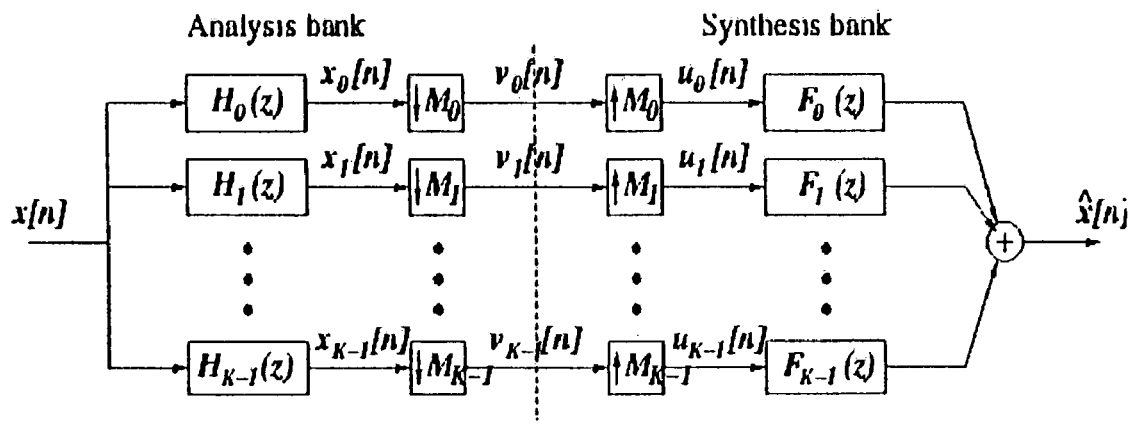
FIG. 4 shows a diagram which illustrates a multi-sampling system using the filter bank approach according to the present invention.

FIG. 4 shows a diagram which illustrates a multi-sampling system using the filter bank approach according to the present invention. An input signal x(n) is separated into K number of signals through K number of analysis filters $H_k(Z)$ and takes in a sample signal at every $M_k \leq k$ time from each signal $x_k(n)$ in order to form a signal $v_k(n)$. In this instance, the signal $v_k(n)$ could be represented in a Z domain.

$$V_k(z) = \frac{1}{M_k} \sum_{m=0}^{M_k-1} X_k(zW_{M_k}^m) \quad \text{[Mathematical Equation 11]}$$

$$= \frac{1}{M_k} \sum_{m=0}^{M-1} H_k(zW_{M_k}) X(zW_{M_k})$$

where $W_{M_i} = e^{-j2zm_k}$. From this signal, $u_k(n)$ is formed by inserting $M_k-1$ number of samples whose value are zero between every two consecutive samples and this could be represented in a Z domain.

$$U_k(z) = V_k(z^{M_i}) \quad \text{[Mathematical Equation 12]}$$

$$= \frac{1}{M_k} \sum_{m=0}^{M-1} H_k(zW_{M_i}^m) X(zW_{M_i}^m)$$

A signal which is nearest to the original signal $\hat{x}(n)$ is restored from $u_k(n)$ through a synthesis filter $F_k(Z)$.

$$\hat{X}(z) = \sum_{k=0}^{K-1} F_k(z) U_k(z) = \quad \text{[Mathematical Equation 13]}$$

$$\frac{1}{M_k} \sum_{m=0}^{M-1} X(zW_{M_k}^m) \sum_{k=0}^{K-1} H_k(zW_{M_k}^m) F_k(z)$$

A polyphase representation is another way of analyzing a multi-sampling system and this representation enables an implementation which reduces the amount of calculation. Also, an implementation based on Fast Fourier Transform could also be considered.

Figure 5:
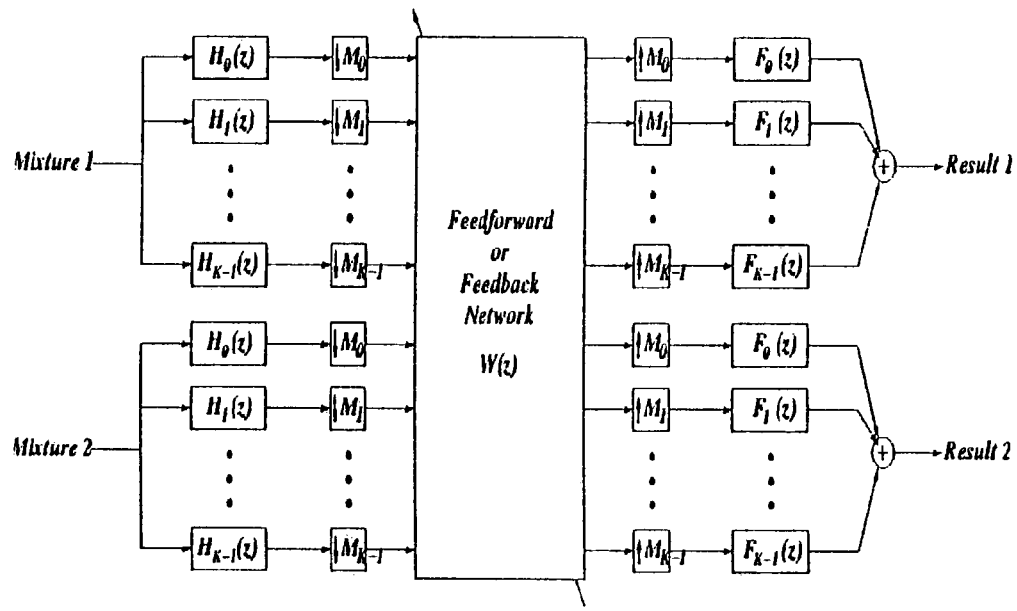
FIG. 5 shows a diagram which illustrates a default signal separator using the filter bank approach according to the present invention.

FIG. 5 shows a diagram which illustrates the structure of default signal separator using the filter bank approach according to the present invention. Each input signal passes through an analysis filter bank and K number of signals are constructed by taking one sample at $M_k$ time for an output signal $H_k(z)$. The separated signals could be obtained by applying the default signal separation method using independent component analysis to this signal and the original separation signal could be restored by inserting $M_k-1$ number of samples whose value are zero between every two consecutive samples and passing them through synthesis filter banks.

In this instance, as mentioned previously, the default signal separator using independent component analysis produces output signals whose magnitude and sequence are reversed. Hence, the output signals whose magnitude and sequence are reversed are produced after receiving input signals from the analysis filter bank. In order to recover the original sound source signal, the processes of compensating the magnitude of the signals and collecting the output signals from an identical source among the reversed signals are required. In general, the process of magnitude compensation for a feedback filter structure is carried out by fixing the filter coefficients as $w_{ij}(0)=1$ which have no time delay between the input and output with the same index or fixing specific values to the specific time delay filter coefficients. Also, the process of a magnitude compensation for the feedforward filter structure is carried out by fixing specific values to the specific time delay coefficients or normalizing the filter coefficients in order to make the energy ratio constant between the input and output which are transferred through a network.

The process of collecting the output signals from an identical source among the signals whose magnitude and sequence are reversed is carried out, by comparing the a number of characteristics including a statistical characteristic of cumulant or the correlation of the output signals which corresponds to other analysis filters or by comparing the characteristics of the feedback or feedforward filter structures.

FIG. 5 represent a structure which consists of two input and two output terminals respectively, however, the total number of input and output terminals for each structure could be increased in order to construct a filter structure with an arbitrary number of input and output terminals. For the filter structure with the arbitrary number of input and output terminals, the same methods could be applied.

The filter bank approach could be applied to adaptive noise filtering method for removing pure noises.

Figure 6:
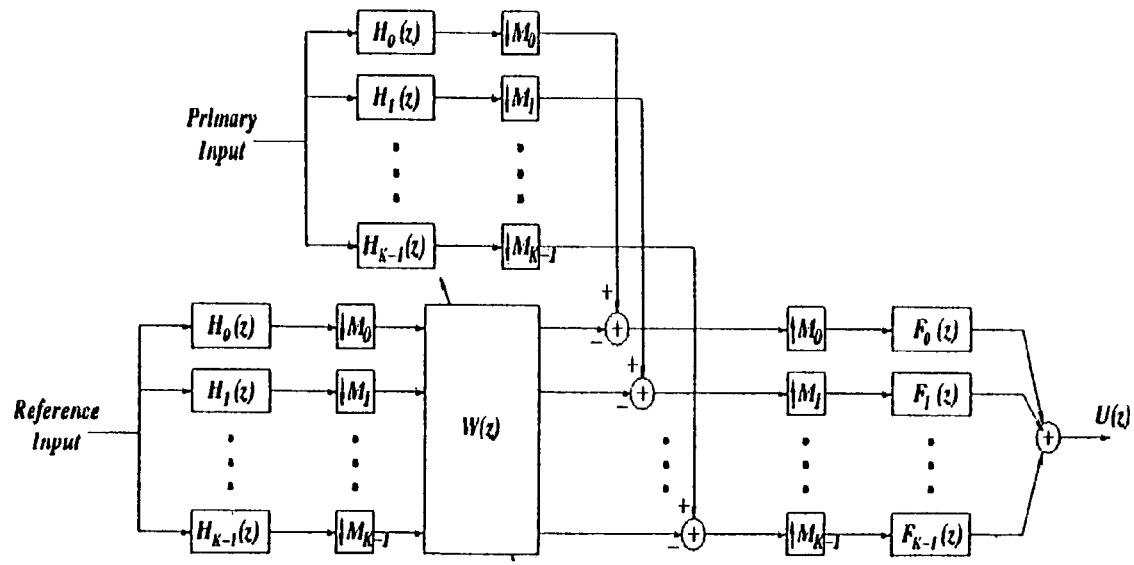
FIG. 6 shows a diagram which illustrates a adaptive noise filter using the filter bank approach according to the present invention.

FIG. 6 shows a diagram which illustrates an adaptive noise filter using the filter bank approach according to the present invention.

Each of the primary and reference inputs pass through an analysis filter bank and after taking one sample at $M_k$ time for an output signal $H_k(t)$, a signal without noises are obtained by applying the adaptive noise filtering method using independent component analysis. The noise filter signal could be restored by passing through a synthesis filter bank after inserting $M_k-1$ number of samples whose values are zero to the above signal.

The adaptive noise filter as in the case of the default signal separator, the total number of input and output terminals for each structure could be increased in order to construct a filter structure with an arbitrary number of input and output terminals. For the filter structure with an arbitrary number of input and output terminals, the same methods could be applied.

The independent component analysis could be applied to various types of adaptive filter algorithms other than default signal separator or adaptive noise filter.

In this case, the filter bank approach, which uses the same method of passing each input signal through an analysis filter bank and applying an adaptive noise filter using independent component analysis after taking one sample at $M_k$ time for an output signal of Kth analysis filter bank $\Pi_k(z)$ and inserting $M_k-1$ number of samples whose values are zero to the above signal and again passing through the analysis filter bank, could be adopted.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof. Finally, as explained so far, according to the filter bank approach to adaptive filtering method using independent component analysis according to the present invention, an improved performance is achieved in terms of reducing the amount of calculation for filter training, improving the learning speed and the quality of result signals when compared to the other methods which do not use the filter bank approach.

What is claimed is:

1. A filter bank approach to adaptive filtering method using independent component analysis, comprising the steps of:
    separating each input signal into a plurality of frequency bands after passing the input signal through an analysis filter bank;
    constructing signals whose number is equal to the total number of analysis filters by selecting one sample from an arbitrarily determined number of samples for a filter output corresponding to each frequency band;
    applying the adaptive filtering method using independent component analysis to said above signals as a whole;
    inserting a number of samples which is one less than said determined number of samples and having zero values between two consecutive samples; and
    restoring result signals after passing through a synthesis filter bank.

2. The method as claimed in claim 1, wherein said filter bank multi-sampling system is implemented by a polyphase representation or Fast Fourier Transform which uses the special relationship of the analysis filter bank or synthesis filter bank.

3. The method as claimed in claim 2, further including the steps of compensating the magnitude of the signal and collecting the output signal from an identical source among the signals whose magnitude and sequence are reversed in order to recover the original sound source signal after said adaptive filter algorithm is applied.

4. The method as claimed in claim 1, further including the steps of compensating the magnitude of the signal and collecting the output signal from an identical source among the signals whose magnitude and sequence are reversed in order to recover the original sound source signal after said adaptive filter algorithm is applied.

5. The method as claimed in claim 4, further including the steps of fixing specific values to the filter coefficients between the input and output or normalizing the filter coefficients in order to make the energy ratio constant between the input and output via a network to compensate for the magnitude of the restored original sound source after said adaptive filter algorithm is applied.

6. The method as claimed in claim 4, further including the steps of collecting the output signals from an identical source among the signals whose magnitude and sequence are reversed by comparing the a number of characteristics including the statistical characteristics of cumulant or the correlation of the output signals which corresponds to other analysis filters in order to recover the original sound source signal after said adaptive filter algorithm is applied.

7. A filter bank approach to default signal separation method using independent component analysis for a feedback or feedforward structures with an arbitrary number of input and output terminals or the structures where some part of adaptive filter coefficients are omitted, comprising the steps of:
    separating each input signal into a plurality of frequency bands after passing the input signal through an analysis filter bank;
    constructing signals whose number is equal to the total number of analysis filters by selecting one sample from an arbitrarily determined number of samples for a filter output corresponding to each frequency band;
    applying the default signal separation method using independent component analysis to said above signals as a whole;
    inserting a number of samples which is one less than said determined number of samples and having zero values between two consecutive samples; and
    restoring result signals after passing through a synthesis filter bank.

8. The method as claimed in claim 7, wherein said filter bank multi-sampling system is implemented by a polyphase representation or Fast Fourier Transform which uses the special relationship of the analysis filter bank or synthesis filter bank.

9. The method as claimed in claim 8, further including the steps of compensating the magnitude of the signal and collecting the output signal from an identical source among the signals whose magnitude and sequence are reversed in order to recover the original sound source signal after said default signal separation method is applied.

10. The method as claimed in claim 7, further including the steps of compensating the magnitude of the signal and collecting the output signal from an identical source among the signals whose magnitude and sequence are reversed in order to recover the original sound source signal after said default signal separation method is applied.

11. The method as claimed in claim 10, wherein the filter coefficients with no time delay between the input and output with an identical index are fixed as $W_{ii}(0)=1$ or fixing the values of specific time delay filter coefficients as specific values in order to recover the original sound source signal after said default signal separation method is applied.

12. The method as claimed in claim 10, further including the steps of fixing specific values to the filter coefficients between the input and output or normalizing the filter coefficients in order to make the energy ratio constant between the input and output via a network to compensate for the magnitude of the restored original sound source after said default signal separation method is applied.

13. The method as claimed in claim 10, further including the steps of collecting the output signals from an identical source among the signals whose magnitude and sequence are reversed by comparing the a number of characteristics including the statistical characteristics of cumulant or correlation of the output signals which corresponds to other analysis filters in order to recover the original sound source signal after said default signal separation method is applied.

14. A filter bank approach to adaptive noise filter method using independent component analysis wherein each of the signals that forms the primary signal, mixed signal of noises and noise signal that forms the reference input is inputted, comprising the steps of:
   separating each input signal into a plurality of frequency bands after passing the input signal through an analysis filter bank;
   constructing signals whose number is equal to the total number of analysis filters by selecting one sample from an arbitrarily determined number of samples for a filter output corresponding to each frequency band;
   applying the adaptive noise filter method using independent component analysis to said above signals as a whole;
   inserting a number of samples which is one less than said determined number of samples and having zero values between two consecutive samples; and
   restoring result signals after passing through a synthesis filter bank.

15. The method as claimed in claim 14, wherein said filter bank multi-sampling system is implemented by a polyphase representation or Fast Fourier Transform which uses the special relationship of the analysis filter bank or synthesis filter bank.

16. The method as claimed in claim 15, wherein the number of the input or output terminals of said adaptive noise filter is increased in order to increase the filter range of various type of signals corresponding to noise by obtaining multitudes of mixed signal of noises or noises.

17. The method as claimed in claim 14, wherein the number of the input or output terminals of said adaptive noise filter is increased in order to increase the filter range of various type of signals corresponding to noise by obtaining multitudes of mixed signal of noises or noises.

18. A filter bank approach to default signal separation and adaptive noise filter methods using independent component analysis wherein each of the signals that forms the primary signal, mixed signal of noises and noise signal that forms the reference input is inputted, comprising the steps of:
   separating each input signal into a plurality of frequency bands after passing the input signal through an analysis filter bank;
   constructing signals whose number is equal to the total number of analysis filters by selecting one sample from an arbitrarily determined number of samples for a filter output corresponding to each frequency band;
   applying default signal separation and adaptive noise filter methods using independent component analysis to said above signals as a whole;
   inserting a number of samples which is one less than said determined number of samples and having zero values between two consecutive samples; and
   restoring result signals after passing through a synthesis filter bank.

19. The method as claimed in claim 18, wherein said filter bank multi-sampling system is implemented by a polyphase representation or Fast Fourier Transform which uses the special relationship of the analysis filter bank or synthesis filter bank.

20. The method as claimed in claim 19, further including the steps of compensating the magnitude of the signal and collecting the output signal from an identical source among the signals whose magnitude and sequence are reversed in order to recover the original sound source signal after said default signal separation and adaptive filter algorithm are applied.

21. The method as claimed in claim 18, further including the steps of compensating the magnitude of the signal and collecting the output signal from an identical source among the signals whose magnitude and sequence are reversed in order to recover the original sound source signal after said default signal separation and adaptive filter algorithm are applied.

22. The method as claimed in claim 21, wherein the filter coefficients with no time delay between the input and output with an identical index are fixed as $w_{ii}(0)=1$ or fixing the values of specific time delay filter coefficients as specific values in order to recover the original sound source signal after said default signal separation and adaptive filter methods are applied.

23. The method as claimed in claim 21, further including the steps of fixing specific values to the filter coefficients between the input and output or normalizing the filter coefficients in order to make the energy ratio constant between the input and output via a network to compensate for the magnitude of the restored original sound source after said default signal separation and adaptive filter methods are applied.

24. The method as claimed in claim 21, further including the steps of collecting the output signals from an identical source among the signals whose magnitude and sequence are reversed by comparing the a number of characteristics including the statistical characteristics of cumulant or the correlation of the output signals which corresponds to other analysis filters in order to recover the original sound source signal after said default signal separation and adaptive filter methods are applied.

* * * * *